(12) United States Patent
Shaikh

(10) Patent No.: US 6,940,897 B2
(45) Date of Patent: Sep. 6, 2005

(54) SYSTEM AND METHOD FOR A HIGHLY-PROGRAMMABLE FIR FILTER

(75) Inventor: Ali I. Shaikh, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 710 days.

(21) Appl. No.: 09/794,830

(22) Filed: Feb. 27, 2001

(65) Prior Publication Data

US 2002/0161806 A1 Oct. 31, 2002

(51) Int. Cl.[7] .................................................. H04B 1/38
(52) U.S. Cl. .................. 375/232; 375/240.08; 375/350; 382/254; 382/275
(58) Field of Search ................................. 375/232, 222, 375/130, 240.08, 346, 350; 382/240, 254, 266, 275, 282; 708/319, 625; 370/545

(56) References Cited

FOREIGN PATENT DOCUMENTS

EP        0 975 091 A2     1/2000

OTHER PUBLICATIONS

"Low Power Signal Processing Architectures for Network Microsensors," Dong et al. *International Symposium on Low Power Electronics and Design.* Aug. 18–20, 1997. p. 173–177.

"30–MSamples/s Programmable Filter Processor," Golla et al. *IEEE Journal of Solid–State Circuits.* Dec. 1990. vol. 25, No. 6.

*Primary Examiner*—Young T. Tse
*Assistant Examiner*—Edith Chang
(74) *Attorney, Agent, or Firm*—Gauthier & Connors LLP

(57) ABSTRACT

A highly-programmable Finite Impulse Response (FIR) digital filter overcomes the limitations of conventional configurations. Specifically, a compound FIR filter configuration is provided, offering the advantages of heightened programmability in both transfer function coefficients hf, hg and in degree of interpolation; distribution and sharing of resources between F and G filter portions, mode-switching capability between high-pass and low-pass modes, and programmable truncation/saturation.

25 Claims, 10 Drawing Sheets

SYSTEM AND METHOD FOR A HIGHLY-PROGRAMMABLE FIR FILTER

BACKGROUND OF THE INVENTION

In conventional Finite Impulse Response (FIR) digital filter configurations, as a result of interpolation of an input signal, high-order images are generated at multiples of the interpolation sampling rate. Such conventional "unitary" filters that seek to provide the combined goals of superior filter characteristics (stop band, passband, transition band) with needed suppression of the high-order images, are complicated in configuration, as they require high-order design, and are therefore expensive to implement.

For this reason, a new "compound" filter configuration has recently evolved, wherein the interpolation and suppression functions are partitioned into separate filters: a first portion, referred to as the interpolation, or "F", filter, being optimized for superior frequency discrimination characteristics; and a second portion, referred to as the masking, image suppression, or "G", filter, being optimized to suppress higher order images. The resulting compound transfer function of the F and G components provides superior overall filter characteristics using two relatively lower-order filters. By distributing the F and G functions, and optimizing each individually, the performance of the collective configuration is at least comparable to that of conventional unitary configurations, while simplifying hardware complexity, as lower-order filters can be employed.

FIG. 1A is a schematic block diagram of a contemporary compound high-pass FIR filter. Digital data is received at input 26. The data is processed by an interpolation filter 20 whose transfer function F is represented by the following relationship:

$$yf[n] = \sum_{kf} (hf[kf] \times x[n - (N \times kf)]) \quad (1)$$

where x(n) represents the input data, hf represents impulse response coefficients for the F filter, kf represents the coefficient count for the F filter, N represents the interpolation value for the F filter; and yf[n] represents data output from the F filter.

Data 28 output from the interpolation filter 20 is processed by a masking filter 22 whose transfer function G is represented by the following relationship:

$$yg[n] = \sum_{kg} (hg[kg] \times x[n - kg]) \quad (2)$$

where x(n) represents data input to the G filter, hg represents impulse response coefficients for the G filter; kg represents the coefficient count for the G filter; and yg[n] represents data output from the G filter.

A feed forward path in the form of a subtractor 30, with delay function 24, is configured as shown in FIG. 1A to provide for alternative frequency discrimination settings (e.g., high-pass, band pass, band stop, etc.) in the FIR filter. Otherwise, as shown in FIG. 1B, absent the subtractor 30 and the feed forward path, the FIR filter operates as a low-pass filter.

It can be seen in the above Equations 1 and 2 that each iteration of the summation requires a multiplication operation, which can be costly in terms of processing time and hardware complexity. As explained above, the compound filter configuration distributes the interpolation and masking processes into separate F and G functions, which reduces complexity of each separate function, as compared to the conventional combined function. For this reason, the F and G filters are relatively low-order, and therefore have a relatively lower number of impulse response coefficients hf, hg, referred to in the art as "taps". With relatively fewer taps, the filter functions rely on fewer multiplication operations, and therefore processing time is improved, and hardware complexity is reduced.

While offering the above advantages, current compound filter configurations employ F and G filters that are limited to fixed coefficients. For this reason, the overall filter transfer function is fixed at the time of fabrication, and therefore the filter is not adaptable to variances in environment or data. In addition, the overall system throughput is limited by the filter having the highest number of taps.

SUMMARY OF THE INVENTION

The present invention provides a highly-programmable Finite Impulse Response (FIR) digital filter that overcomes the limitations of conventional configurations. Specifically, the present invention provides a compound FIR filter configuration, offering the advantages of heightened programmability in both transfer function coefficients hf, hg (both in number and value), and in degree of interpolation; distribution and sharing of resources between F and G filter portions, and advanced truncation. The present invention further provides for optional programmability between various frequency discrimination settings (e.g., high-pass, bandpass, etc).

In a first aspect, the present invention is directed to a compound filter for processing digital data. A first filter portion includes first computational resources for performing a first filter function. A second filter portion includes second computational resources for performing a second filter function. At least one of the first and second filter portions is configured to access and utilize the computational resources of the other filter portion for performing the filter function.

In one embodiment, the first and second filter portions each include a data bank having a plurality of data nodes, a coefficient bank for storing filter coefficients, a multiplier for multiplying filter data stored in the data nodes by corresponding filter coefficients stored in the coefficient bank, resulting in product data, and an accumulator for summing the product data to produce filtered data.

The data bank may include a negative data bank having negative data nodes, a positive data bank having positive data nodes, and an adder for summing filter data contained in corresponding positive and negative data nodes prior to multiplication with the corresponding filter coefficient. The data nodes may comprise data registers, or may comprise memory locations referenced by pointers. The first filter portion may comprise an interpolation filter or a masking filter.

The first filter portion may include a first number of filter nodes and the second filter portion may include a second number of filter nodes and the first and second filter portions may share their respective resources when the first number and second number are different. The resources may comprise an adder, a multiplier, and an accumulator. The first and second filter functions are determined by programmable filter coefficient values and count, and interpolation. The resources may include a programmable truncation unit for performing saturation, truncation, and rounding of the outputs the first and second filter portions.

A delay unit may be coupled between an output of the second filter portion and an input of the first filter portion such that the compound filter is configured as a different frequency discrimination filter (e.g., high-pass filter). A programmable switch may be coupled to the delay unit for activating the delay unit such that the filter system is operable at various frequency discrimination settings, depending on the switch position.

In another aspect, the present invention is directed to a method for processing digital data in a compound filter. A first filter function is performed in a first filter portion having first computational resources. A second filter function is performed in a second filter portion having second computational resources. At least one of the first and second filter portions is configured to access and utilize the computational resources of the other filter portion for performing the filter function.

BRIEF DESCRIPTION OF THE DRAWINGS

The foregoing and other objects, features, and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1A:
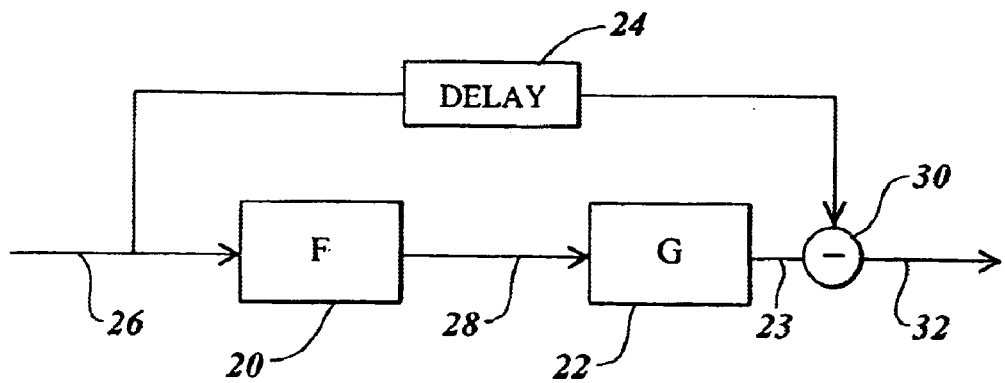
FIGS. 1A and 1B are schematic block diagrams of a compound Finite Impulse Response (FIR) filter configured as high-pass and low-pass filters, respectively.
Figure 1B:
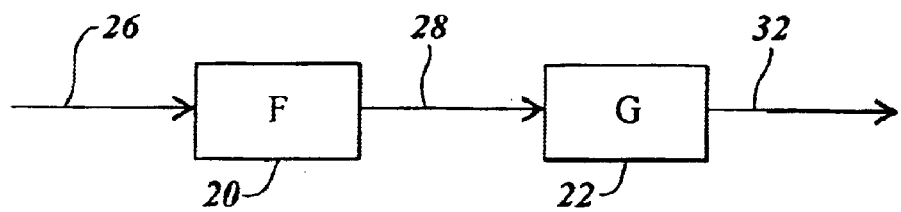
Figure 2:
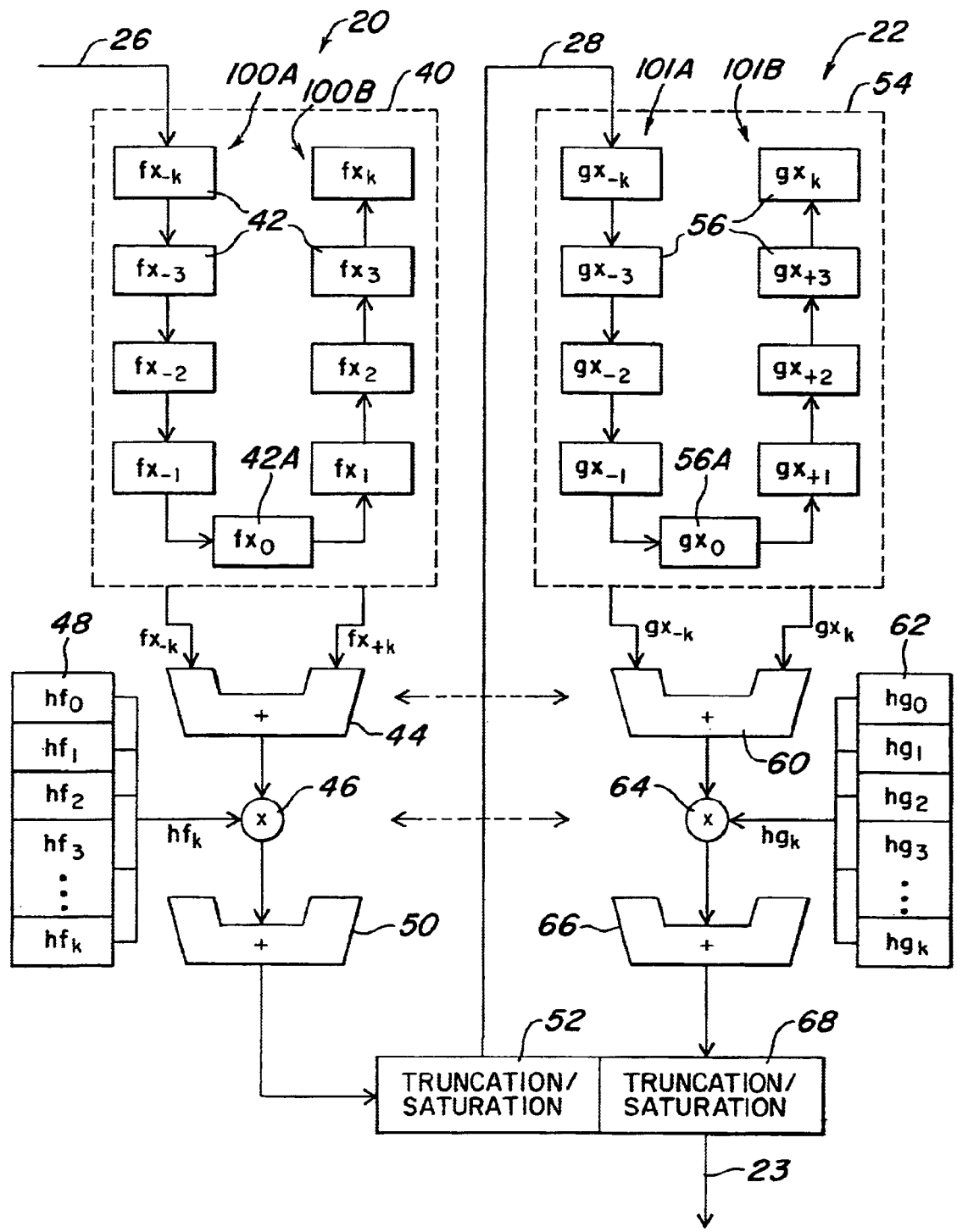
FIG. 2 is a detailed schematic block diagram of a compound FIR filter configured in accordance with the present invention.

FIG. 2 is a detailed schematic block diagram of a compound FIR filter configured in accordance with the present invention. An F-filter (for example, interpolation filter) portion 20 includes an F-filter data bank 40, an adder 44, a multiplier 46, an F-filter coefficient bank 48, an accumulator 50, and truncation/saturation hardware 52. Similarly, a G-filter (for example, masking) portion 22 includes a G-filter data bank 54, an adder 60, a multiplier 64, a G-filter coefficient bank 62, an accumulator 66, and truncation/saturation hardware 68. The truncation/saturation hardware 52, 68 of the F-filter and G-filter may optionally be combined into a single unit whose resources are shared by the F and G filters 20, 22. Input data 26 is received, processed by the F-filter 20, and the F-filter processed data 28 is provided to, and processed by, the G-filter 22, resulting in output data 23.

The F-filter data bank 40 includes a plurality of data registers 42, or memory locations, for temporary storage of the input data $fx_k$. The data 26 are input into the data bank, and at each cycle, progress to the next data bank memory location 42, as shown. Either the data itself may be shifted, for example by shift register, or else pointers to the memory locations where the data are stored may be appropriately controlled, to keep the data locations current. A detailed example of pointer control and maintenance is provided below.

For each time value k, the data $fx_k$ are multiplied by their corresponding F-filter coefficient values $hf_k$ at multiplier 46. Assuming that the filter is symmetric for values of +k and −k, the number of multiplication operations may be essentially halved by first adding the values of the positive and negative data nodes $fx_k$ and $fx_{-k}$ at adder 44 and multiplying the sum by the corresponding F-filter coefficient value $hf_k$ at multiplier 46, according to the relationship:

$$y[n] = \sum_{k=-NI}^{NI} hf[k] \times x[n-(N-k)] \quad (3)$$

for the general case, and $$y[n] = hf[0] \times x[n-N] + \sum_{k=1}^{NI} hf[k] \times \{x[n-(N-k)] + x[n-(N+k)]\} \quad (4)$$

for the case where the impulse response is symmetric.

The result of each multiplication is accumulated in accumulator 50 for all k values, and the resulting F-filtered data 28 is provided to the G-filter 22.

Similarly, the G-filter data bank 54 includes a plurality of data registers, or memory locations 56, for temporary storage of the input data $gx_k$. The data 28 are input into the data bank 54, and at each cycle, progress to the next data bank location 56, as shown. As described above, either the data itself may be shifted, or pointers to the memory locations where the data are stored may be adjusted to keep the data locations current.

For each time value k, the data $gx_k$ are multiplied by their corresponding G-filter coefficient values $hg_k$ at multiplier 64. Note that since the G-filter performs a different function than the F-filter, its coefficients are different. Assuming the G-filter transfer function to be symmetric for values of +k and −k, the number of multiplication operations may be essentially halved by first adding the positive and negative data values $gx_k$ and $gx_{-k}$ at adder 60 and multiplying the sum by the corresponding G-filter coefficient value $hg_k$ at multiplier 64, according to the relationship:

$$y[n] = \sum_{k=-N2}^{N2} hg[k] \times x[n-k] \quad (5)$$

for the general case, and $$y[n] = hg[0] \times x[n] + \sum_{k=1}^{N2} hg[k] \times \{x[n-k] + x[n+k]\} \quad (6)$$

for the case where the impulse response is symmetric.

In many compound filtering applications utilizing the above configuration, it is common to have different order numbers, (also referred to as "taps", or "k" values) in the F and G filters. Assuming this, the filters may be performing different numbers of multiplication operations, and therefore, data processing by one filter may be under greater, or less, computational demand relative to the other. Since the filters effectively operate on the data in a serial process, this difference means that there are times when system resources are not fully utilized. For example, one filter may have a dormant data path while waiting for the other filter to complete its processing.

The present invention addresses this issue by sharing such resources between the F and G filters. In other words, when it is determined that one filter requires more multiplication operations than the other filter, then the filter having extra resources temporarily lends its resources to the other filter, leading to more efficient system operation.

Figure 3:
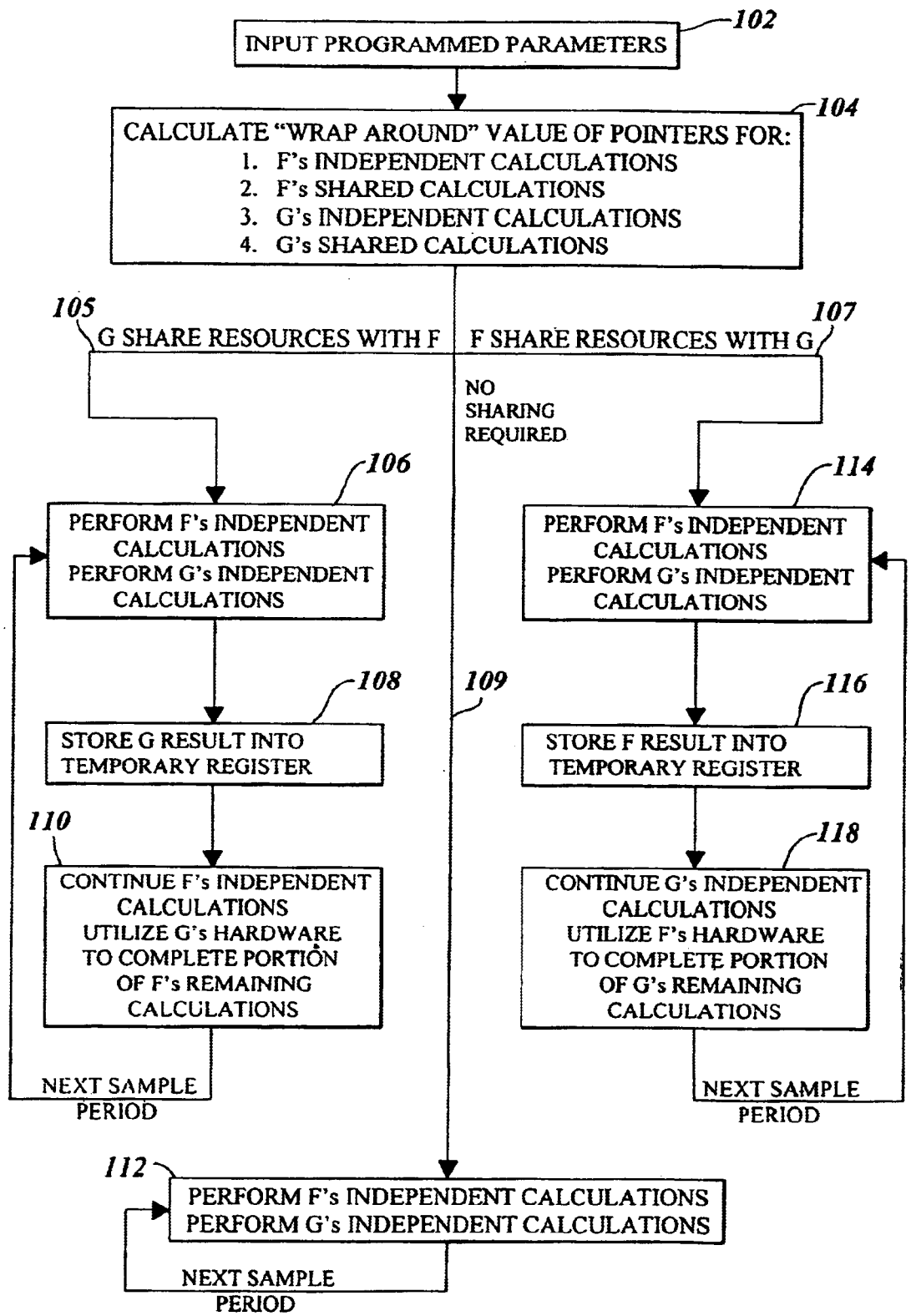
FIG. 3 is a flow diagram illustrating the sharing of resources between F and G portions of the FIR filter, in accordance with the present invention.

Referring to FIG. 3, which is a flow diagram in accordance with the present invention, the sharing of resources between F and G portions of the FIR filter is illustrated. This embodiment is particularly applicable to a filter bank application that employs pointers for managing the locations of the input data.

Initially, a user employs a high-level modeling tool to determine a desired filter shape. The tool in turn generates parameters that define the desired F and G FIR digital filters. Such parameters may include, for example, the number of coefficients for the F and G filters, coefficient values for the F and G filters, an interpolation value of the F filter, saturation, truncation and rounding values of the F and G filters, and a mode value for programming various frequency discrimination settings.

At initialization, the program parameters are input, at step 102, to the filter system of the present invention. The parameters may be stored, for example in on-board or on-chip Random Access Memory (RAM) or Read-Only Memory (ROM), or a programmable register bank may otherwise be provided by a user. The burden of the filter on system resources is determined based on the parameters, which in turn determine the number of multiplications required for each filter at each input data sample period, and based on this, it is determined whether the F-filter is to share resources with the G-filter, whether the G-filter is to share resources with the F filter, or whether no sharing is required.

In each instance, memory is allocated for the G-filter and the F-filter input data, and referenced by pointers that access the memory locations. In a preferred embodiment, the memory allocated for the F-filter comprises dual-port RAM, while the memory allocated for the G-filter may comprise a register bank having a multiple data path. Such a configuration allows for sharing of resources between the filters, while minimizing occupation of integrated circuit real estate. With reference again to FIG. 2, assuming that the memory bank 40 for the F-filter data 42 comprises a dual port memory having dual address and data lines for access to memory locations, the first port, port 1, may be configured to transfer data to the adder 44 and multiplier 46 local to the F-filter 20, while the second port, port 2, may be configured to transfer the data to the adder 60 and multiplier 64 local to the G-filter 22. In this manner, both the positive and negative data nodes 100A, 100B respectively can be ported over to utilize the resources of the G-filter 22, while at the same time, the coefficients 48 (which, for example, can also be stored in dual-port RAM) pertaining to the F-filter 20 are also ported over to the G-filter 22 to enable multiplication of the F-filter data with the F-filter coefficients utilizing the G-filter multiplier 64. A storage capability, again either in the form of a register or pointer-managed memory, stores values obtained by a filter's independent calculations, while its resources are shared with the other filter. In a preferred embodiment, the storing, sharing, and maintenance of the data and coefficients of each filter are controlled through the use of pointers controlled to refer to specific memory locations in the dual-port memory bank.

Returning to FIG. 3, "wrap-around" values pertaining to the number of pointers required for the F and G filters, are calculated for: 1.) the F-filter's independent calculations, 2.) the F-filter's shared calculations, 3.) the G-filter's independent calculations, and 4.) the G-filter's shared calculations as shown in step 104. The calculation of the wrap-around values is described in further detail below.

Based on the input parameters received at step 102, it is determined whether the G-filter is to share resources with F-filter 105, whether the F-filter is to share resources with the G-filter 107, or whether no sharing of resources is required 109. Assuming that the G-filter is to share resources with F-filter 105, initially, the F-filter's independent calculations are performed using F-filter's resources, and G-filter's independent calculations are performed using G-filter's resources, as shown in step 106. Next, the results of the G-filter's calculations are stored in a temporary register 108. In step 110, the F-filter's independent calculations are continued using the F-filter's resources and, in addition, G-filter's resources are used to complete the portion of F-filter's remaining calculations, as shown in shown in 110. At the next sample period, the cycle repeats by performing the independent calculations of the respective filters 106, followed by steps 108, 110.

Alternatively, if it is determined that the F-filter is to share resources with the G-filter, 107, a similar resource-sharing procedure applies, by initially performing the F-filter's and G-filter's independent calculations using their respective resources 114, by storing the F-filter's results in a temporary register 116, and by sharing the F-filter's resources to complete a portion of the G-filter's remaining calculations 118, as described above.

In the event that no resource sharing is required 109, the independent calculations of F-filter are performed by F-filter's resources and the independent calculations of the G-filter are performed by the G-filter's resources at each sample period 112.

With reference to FIG. 2, filter operation in the preferred embodiment of the present invention is dependent on the address generation of data bank pointers, which include read pointers for reading data from the negative and positive data node banks of the F- and G-filters 100A, 100B, 101A, 101B and write pointers for writing data into the negative and positive data node banks of the F- and G-filters 100A, 100B, 101A, 101B; center data pointers for reading data from the center data nodes of the F- and G-filters 42A, 56A (the center data nodes 42A, 56A being preferably affiliated with the negative data node banks 100A, 101A); a high-pass subtract data pointer for reading data from the positive data node bank of the F-filter 100B from which is subtracted the output 23, when the high-pass filter mode is activated; and coefficient bank pointers for reading coefficients from the F- and G-filter coefficient banks 48, 62.

Pointer operation is described below with the assistance of the pointer update flow diagrams described below with reference to FIGS. 5–11. Determination of the coefficient bank pointers utilizes a simple linearly incrementing address calculated during each sample period for the number of multiplies required to complete the calculation. For example, the addresses may increment from an initial value of 1 to the coefficient count for the filter. Under conditions of symmetry, as assumed in this embodiment, the total coefficient count is an odd number, and the number of coefficients loaded in each coefficient bank is represented by:

$$[(\text{Total\_Coefficient\_Count})/2]+1 \quad (7)$$

where the "+1" quantity arises from the coefficient used for the multiplication of the center data, while "[(Total_Coefficient_Count)/2]" refers to the coefficients used for multiplication with the data bank pre-adder 44 outputs. Symmetry allows for a halving of the number of multiplication operations.

The wrap-around value of a pointer of each filter is based on the number of coefficients 48,62 used by the filter. For the F-filter, the wrap-around value of the pointer is further based on the interpolation value of the filter. As described above, and referring to FIG. 2, the data path for each filter 40, 54, is partitioned into negative and positive data nodes: 100A, 101A being the negative data nodes for the F and G filters, respectively, and 100B, 101B being the positive data nodes for the F and G filters respectively.

Wrap-around values are calculated to determine the address value at which a memory pointer will wrap around to the initial memory location address value designated for the filter. In a preferred embodiment, the wrap-around values are calculated according to the following relationships:

for the F-filter:

$$\text{wavf1} = ((\text{FCoeffCntAdjust}) \times (\text{FPtrIncVal}+1))-1 \quad (8)$$

$$\text{wavf2} = ((\text{FCoeffCnt}) \times (\text{FPtrIncVal}+1))-1 \quad (9)$$

where wavf1 and wavf2 represent the first and second wrap-around values for the F-filter, and wherein FcoeffCnt represents the coefficient count defined for the F-filter and wherein FCoeffCntAdjust is equal to the FCoeffCnt if the coefficient count is less than a fixed number, for example the number of clock cycles in the sample period available for performing multiply operations, or else is set equal to the fixed number; and where in FptrIncVal represents the F-filter interpolation value.

Similarly, for the G-filter the first and second wraparound values are calculated as follows:

$$\text{wavg1} = (\text{GCoeffCntAdjust})-1$$

$$\text{wavg2} = (\text{GCoeffCnt})-1 \quad (10), (11)$$

where GcoeffCnt represents the coefficient count defined for the G-filter and wherein GcoeffCntAdjust is set equal to the GCoeffCnt value if the coefficient is less than a fixed number, for example the number of available clock cycles in the sample period for performing multiply operations, otherwise it is set to the fixed number.

Following calculation of the wrap-around values, read and write pointers are determined for each of the positive and negative data banks for each of the F and G filters. The pointer values continually evolve as data processing is conducted, since the pointer values determine not only the mapping of data values within a filter, but also the mapping of data values between filters as their resources are shared.

The following is an example of the operations involved in the various pointer calculations.

Assume each data sample period to be 16 clock cycles, which limits the number of multiplication operations for each data path to be a number less than 16, for example 14. Assume also that the filter impulse responses are symmetric, which allows for a halving of the number of multiplication operations (with the exception of the center coefficient multiplication, which is singled out and handled separately).

Assume also that the F-Filter's coefficient count is 35, and therefore the number of multiplication operations is [(35−1)/2+1]=18 (refer to Equation 7). It follows that FcoeffCnt=18−1=17; FcoeffCntAdjust=13. The parameter FcoeffCnt is set to 17 since the total number of multiplication operations required by the filter is 18, and since the center data is read and written using a separate pointer. The parameter FcoefCntAdjust is set to 13 since the maximum number of multiplications available in the sample period is 14, and since the center data is read and written using a separate pointer.

For the G-Filter, assume the coefficient count to be 19, and therefore the number of multiplication operations required is 10, while GcoeffCnt=10−1=9; GcoeffCntAdjust=9. The parameter GcoeffCnt is set to 9 since the total number of multiplication operations required by the filter is 10, and since the center data is read and written using a separate pointer. The parameter GcoeffCntAdjust is also set to 9 since the G filter can be implemented in less than 14 cycles.

Assume also that the F-filter interpolation value is 7, and it follows that FptrIncVal=7−1=6.

In view of the above assumptions, the G-filter is made to share resources with the F-filter, since the G-filter has a number of dormant clock cycles after it completes its own calculations in a 16-clock-cycle data sample period. Referring to the above equations, wavf1=(13*7)−1=90, wavf2=(17*7)−1=118, wavg1=9−1=8; wavg2=9−1=8.

Table 1 depicts the calculation of initial values for the read pointer addresses in the F-filter for sample periods 1–115:

TABLE 1

| Data Sample Period Number | 1 | 2 | 3 | 4 | 5 | 6 | 7 | 8 | 9 | ... | 112 | 113 | 114 | 115 |
|---|---|---|---|---|---|---|---|---|---|---|---|---|---|---|
| F-Filter Negative Data Bank Address Initial Value (FIG. 6) | 6 | 7 | 8 | 9 | 10 | 11 | 12 | 13 | 14 | ... | 117 | 118 | 0 | 1 |
| F-Filter Positive Data Bank Address Initial Value (FIG. 7) | 6 | 5 | 4 | 3 | 2 | 1 | 0 | 118 | 117 | ... | 14 | 13 | 12 | 11 |

Table 2 depicts the calculation of initial values for the read pointer addresses in the pointers in the G filter for sample periods 1–99:

TABLE 2

| Data Sample Period Number | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| G-Filter Negative Data Bank Address Initial Value (FIG. 6) | 0 | 1 | 2 | 3 | 4 | 5 | 6 | 7 | 8 | 0 | 1 | 2 | 3 | 4 |
| F-Filter Negative Data Bank Address Initial Value (shared) | 97 | 98 | 99 | 100 | 101 | 102 | 103 | 104 | 105 | 106 | 107 | 108 | 109 | 110 |
| G-Filter Positive Data Bank Address Initial Value (FIG. 7) | 0 | 8 | 7 | 6 | 5 | 4 | 3 | 2 | 1 | 0 | 8 | 7 | 6 | 5 |
| F-Filter Positive Data Bank Address Initial Value (shared) | 97 | 96 | 95 | 94 | 93 | 92 | 91 | 90 | 89 | 88 | 87 | 86 | 85 | 84 |

| Data Sample Period Number | 15 | 16 | 17 | 18 | 19 | 20 | 21 | 22 | 23 | 24 | ... | 97 | 98 | 99 |
|---|---|---|---|---|---|---|---|---|---|---|---|---|---|---|
| G-Filter Negative Data Bank Address Initial Value (FIG. 6) | 5 | 6 | 7 | 8 | 0 | 1 | 2 | 3 | 4 | 5 | ... | 6 | 7 | 8 |
| F-Filter Negative Data Bank Address Initial Value (shared) | 111 | 112 | 113 | 114 | 115 | 116 | 117 | 118 | 0 | 1 | | 74 | 75 | 76 |
| G-Filter Positive Data Bank Address Initial Value (FIG. 7) | 4 | 3 | 2 | 1 | 0 | 8 | 7 | 6 | 5 | 4 | ... | 3 | 2 | 1 |
| F-Filter Positive Data Bank Address Initial Value (shared) | 83 | 82 | 81 | 80 | 79 | 78 | 77 | 76 | 75 | 74 | ... | 1 | 0 | 118 | where the first value for each data element (i.e. "0" for sample period 1) represents the initial value used for determining the address for the G-filter's calculations, while the second value (i.e. "97" for sample period 1) represents the initial value used for determining the address for the F-filter's calculations, when the G-filer is sharing resources with the F-filter.

Table 3 illustrates a progression by clock cycle of the read pointer values for the F- and G-filters, for sample period 1:

Clock cycle 1 is reserved for the multiplication of the center node data 42A, 56A. The F-filter pointer value increments by 7 due to the interpolation value. No interpolation is present in the G-filter. During cycle 10, the G-filter has completed all multiplication operations, so it now lends resources to the F-filter. At cycle 14, all calculations have been completed in the G-filter, so the resources are dormant for that cycle.

Similarly, Table 4 applies to the progression by clock cycle of the pointer values for the F- and G-filters, for sample period 2:

TABLE 3

Figure 5:
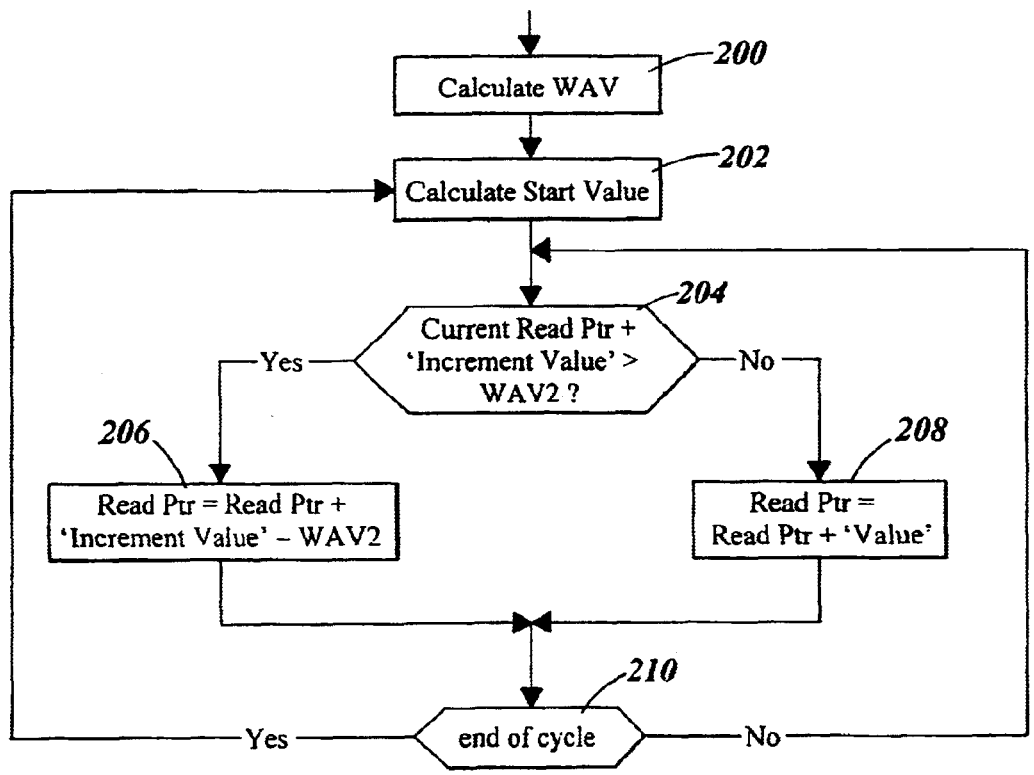
FIG. 5 is a flow diagram illustrating determination of read pointer values, in accordance with the present invention.

(see FIG. 5)

| Clock Cycle | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| F-Filter Negative Data Bank Address Value | na | 6 | 13 | 20 | 27 | 34 | 41 | 48 | 55 | 62 | 69 | 76 | 83 | 90 |
| F-Filter Positive Data Bank Address Value | na | 6 | 13 | 20 | 27 | 34 | 41 | 48 | 55 | 62 | 69 | 76 | 83 | 90 |
| G-Filter Negative Data Bank Address Value | na | 1 | 2 | 3 | 4 | 5 | 6 | 7 | 8 | 97 | 104 | 111 | 118 | na |
| G-Filter Positive Data Bank Address Value | na | 1 | 2 | 3 | 4 | 5 | 6 | 7 | 8 | 97 | 104 | 111 | 118 | na |

TABLE 4

(see FIG. 5)

| Clock Cycle | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| F-Filter Negative Data Bank Address Value | na | 7 | 14 | 21 | 28 | 35 | 42 | 49 | 56 | 63 | 70 | 77 | 84 | 91 |
| F-Filter Positive Data Bank Address Value | na | 5 | 12 | 19 | 26 | 33 | 40 | 47 | 54 | 61 | 68 | 75 | 82 | 89 |
| G-Filter Negative Data Bank Address Value | na | 2 | 3 | 4 | 5 | 6 | 7 | 8 | 0 | 98 | 105 | 112 | 0 | na |
| G-Filter Positive Data Bank Address Value | na | 0 | 1 | 2 | 3 | 4 | 5 | 6 | 7 | 96 | 103 | 110 | 117 | na |

Table 5 depicts the pointer values for the center data address in the F- and G- filters for sample periods 1–123:

TABLE 5

Figure 10:
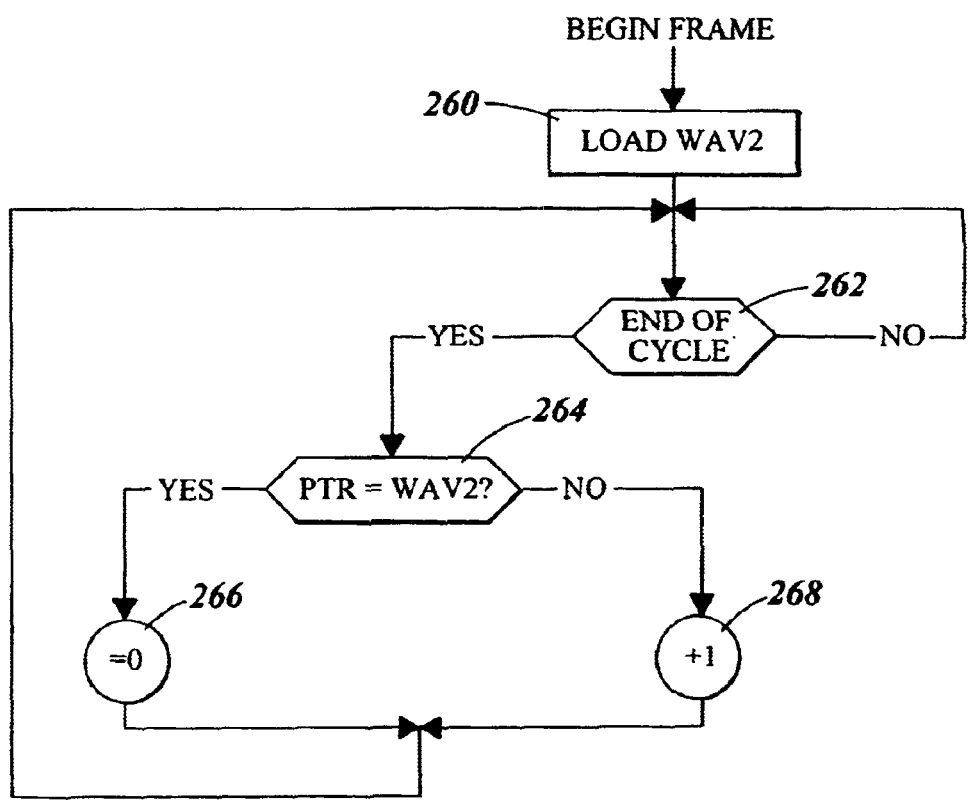
FIG. 10 is a flow diagram illustrating determination of the pointer value for the center data address, in accordance with the present invention.

(see FIG. 10)

| Data Sample Period Number | 1 | 2 | 3 | 4 | 5 | 6 | 7 | 8 | 9 | 10 | 11 | 12 | 13 |
|---|---|---|---|---|---|---|---|---|---|---|---|---|---|
| F-Filter Center Pointer Value | 118 | 0 | 1 | 2 | 3 | 4 | 5 | 6 | 7 | 8 | 9 | 10 | 11 |
| G-Filter Center Pointer Value | 8 | 0 | 1 | 2 | 3 | 4 | 5 | 6 | 7 | 8 | 0 | 1 | 2 |

| Data Sample Period Number | 14 | 15 | 16 | 17 | ... | 116 | 117 | 118 | 119 | 120 | 121 | 122 | 123 |
|---|---|---|---|---|---|---|---|---|---|---|---|---|---|
| F-Filter Center Pointer Value | 12 | 13 | 14 | 15 | ... | 114 | 115 | 116 | 117 | 118 | 0 | 1 | 2 |
| G-Filter Center Pointer Value | 3 | 4 | 5 | 6 | ... | 6 | 7 | 8 | 0 | 1 | 2 | 3 | 4 |

Table 6 depicts the pointer values for the subtract data address with respect to the F-filter for data sample periods 1–13:

TABLE 6

Figure 11:
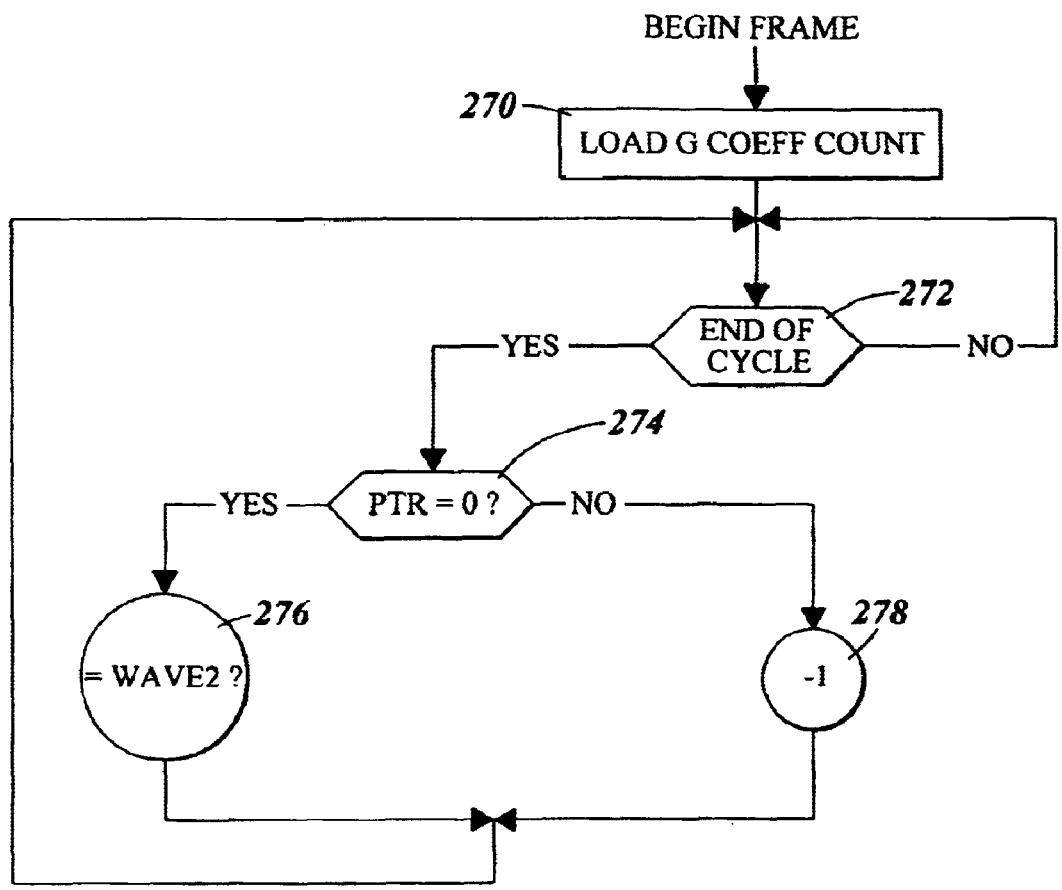
FIG. 11 is a flow diagram illustrating the implementation of the delay block 24 for the high-pass filter node illustrated in FIG. 1A, in accordance with the present invention.

(see FIG. 11)

| Data Sample Period Number | 1 | 2 | 3 | 4 | 5 | 6 | 7 | 8 | 9 | 10 | 11 | 12 | 13 |
|---|---|---|---|---|---|---|---|---|---|---|---|---|---|
| F-Filter Subtract Addr. Ptr Value | 9 | 8 | 7 | 6 | 5 | 4 | 3 | 2 | 1 | 0 | 118 | 117 | 116 |

Table 7 depicts the progression of the write address pointer values for the F- and G-filter for sample periods 1–13:

The F-filter's negative data bank 100A receives incoming filter data. Similarly, the F-filter's center node 42A receives data from the negative data bank 100A, and the positive data bank 100B receives data from the center node 42A. The data then progresses through the G-filter's negative data bank 101A, center node 56A, and positive data filter bank 101B. The data "progression", in this example, is implemented through the use of pointers such that data need not be

TABLE 7

| Data Sample Period Number | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| F-Filter Negative Data Bank Write Pointer Value (FIG. 8) | 118 | 0 | 1 | 2 | 3 | 4 | 5 | 6 | 7 | 8 | 9 | 10 | 11 | 12 |
| F-Filter Positive Data Bank Write Pointer Value (FIG. 9) | 0 | 118 | 117 | 116 | 115 | 114 | 113 | 112 | 111 | 110 | 109 | 108 | 107 | 106 |
| G-Filter Negative Data Bank Write Pointer Value (FIG. 8) | 8 | 0 | 1 | 2 | 3 | 4 | 5 | 6 | 7 | 8 | 9 | 0 | 1 | 2 |
| G-Filter Positive Data Bank Write Pointer Value (FIG. 9) | 0 | 8 | 7 | 6 | 5 | 4 | 3 | 2 | 1 | 0 | 8 | 7 | 6 | 5 | actually moved at each clock cycle, except in the center data node, where the center data register is actually loaded with the latest value, during each data sample period.

The wrap-around values for which filter indicate the maximum value that a given address pointer will increment to before it "wraps-around" to the appropriate initial value, as shown in the flow diagrams.

FIG. 5 is a flow diagram illustrating determination of read pointer values. This flow applies to the positive and negative filter banks 100A, 100B, 101A, 101B for both F- and G-filters. Initially, a wrap-around value is determined as described above, at step 200. Next, a start value for the read pointer is calculated at step 202. This start-value calculation is described in further detail below with reference to FIGS. 6 and 7 for the positive and negative filter data banks respectively. At step 204 it is determined whether the current read pointer plus the increment value exceeds the wrap-around value WAV2. If so, the read pointer is adjusted by the increment value minus the wrap-around value at step 206. If not, the read pointer is adjusted by the increment value. At the end of the cycle 210, for example at the end of the data sample period, i.e. 16 clock cycles, a new initial pointer value is determined at step 202. Otherwise, the process continues at step 204.

While the values of the read address pointer can be represented in a single flow diagram, it should be kept in mind that each pointer is capable of providing for the calculations of the local filter, or of the other filter. In view of this, the wrap-around value for each must be set accordingly. So, with reference to FIG. 5, the WAV value applies to the F-filter for the F-filter's calculations, and applies to the G-filter for the G-filter's calculations. Similarly, the pointer increment value is different for the respective F- and G-filters (i.e., 0 for the G-filter, and (F-filter interpolation value −1) for the F-filter).

Figure 6:
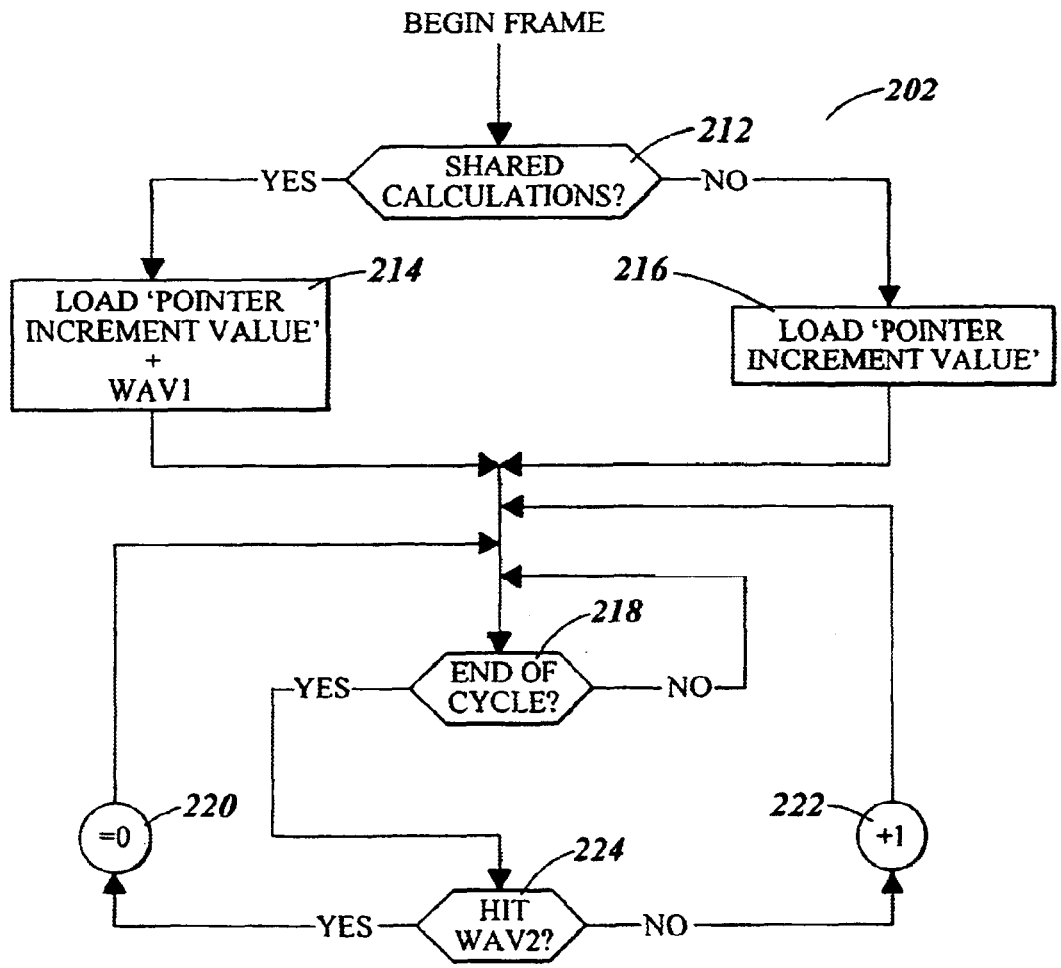
FIG. 6 is a flow diagram illustrating determination of initial read pointer values for the negative data bank, in accordance with the present invention.

FIG. 6 is a flow diagram illustrating determination of the initial value for the read pointer for the negative data banks 100A, 101A in accordance with step 202 of FIG. 5. At the start of a data frame, it is determined whether filter resources are currently being shared at step 212. If so, the pointer increment value is added to the first wrap-around value at step 214. If not, the pointer increment value is loaded as the read pointer start value at step 216. At step 218, the process waits for the end of the cycle. When the end of the cycle is reached, it is determined whether the second wrap-around value has been exceeded at step 224; if not, the pointer start value is incremented at step 222, if so, the pointer start value is reset to zero at step 220.

Figure 7:
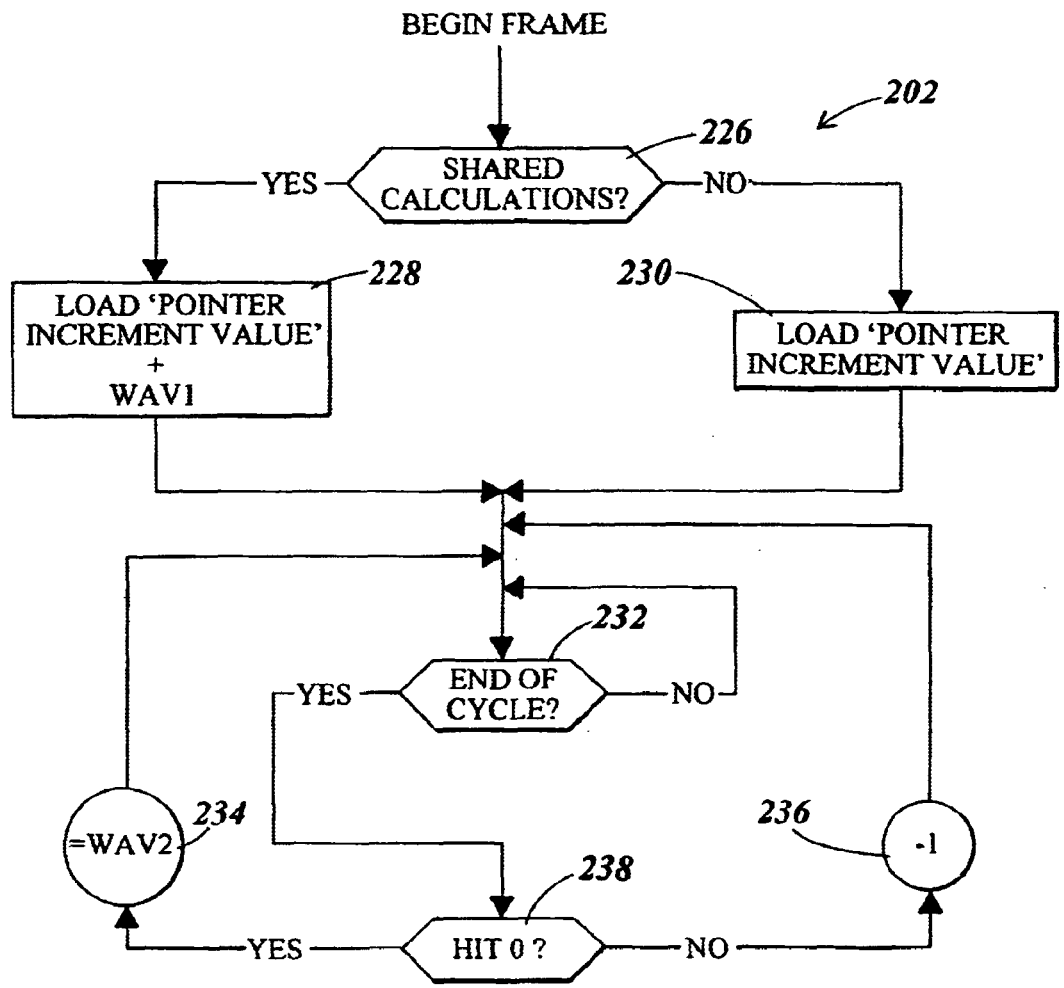
FIG. 7 is a flow diagram illustrating determination of initial read pointer values for the positive data bank, in accordance with the present invention.

Similarly, FIG. 7 is a flow diagram illustrating determination of the initial value for the read pointer for the positive data banks 100B, 101B in accordance with step 202 of FIG. 5. At the start of a data frame, it is determined whether filter resources are currently being shared at step 226. If so, the pointer increment value is added to the first wrap-around value at step 228. If not, the pointer increment value is loaded as the start pointer value at step 230. At step 232, the process waits for the end of the cycle. When the end of the cycle is reached, it is determined whether the pointer start value has reduced to zero at step 238; if not, the pointer start value is decremented at step 236, if so, the pointer start value is reset to the second wrap-around value at step 234.

Figure 8:
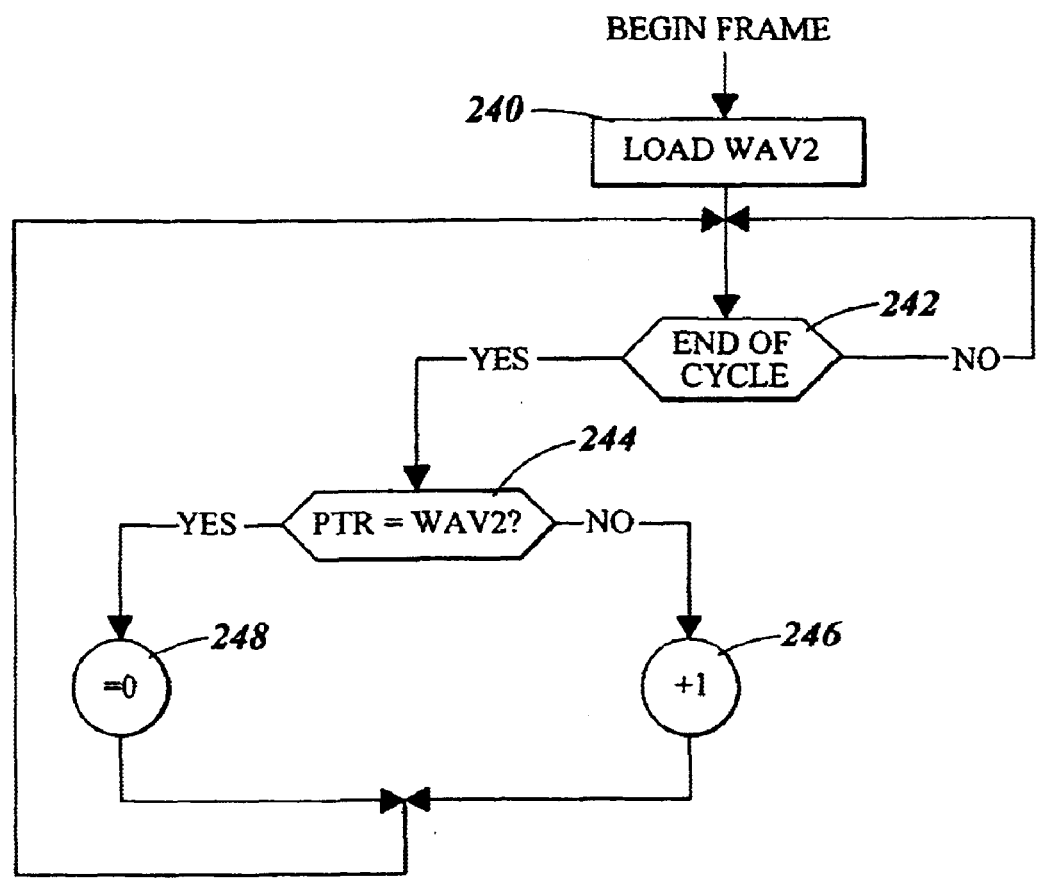
FIG. 8 is a flow diagram illustrating determination of write pointer values for the negative data bank, in accordance with the present invention.

FIG. 8 is a flow diagram illustrating determination of write pointer values for the negative data banks 100A, 101A. At step 240, the write pointer is initially set to the second wrap-around value. At step 242, the process waits for the end of the cycle. When the end of the cycle is reached, it is determined at step 244 whether the write pointer is equal to the second wrap-around value; if not, the write pointer is incremented at step 246; if so, the write pointer is reset to zero at step 248.

Figure 9:
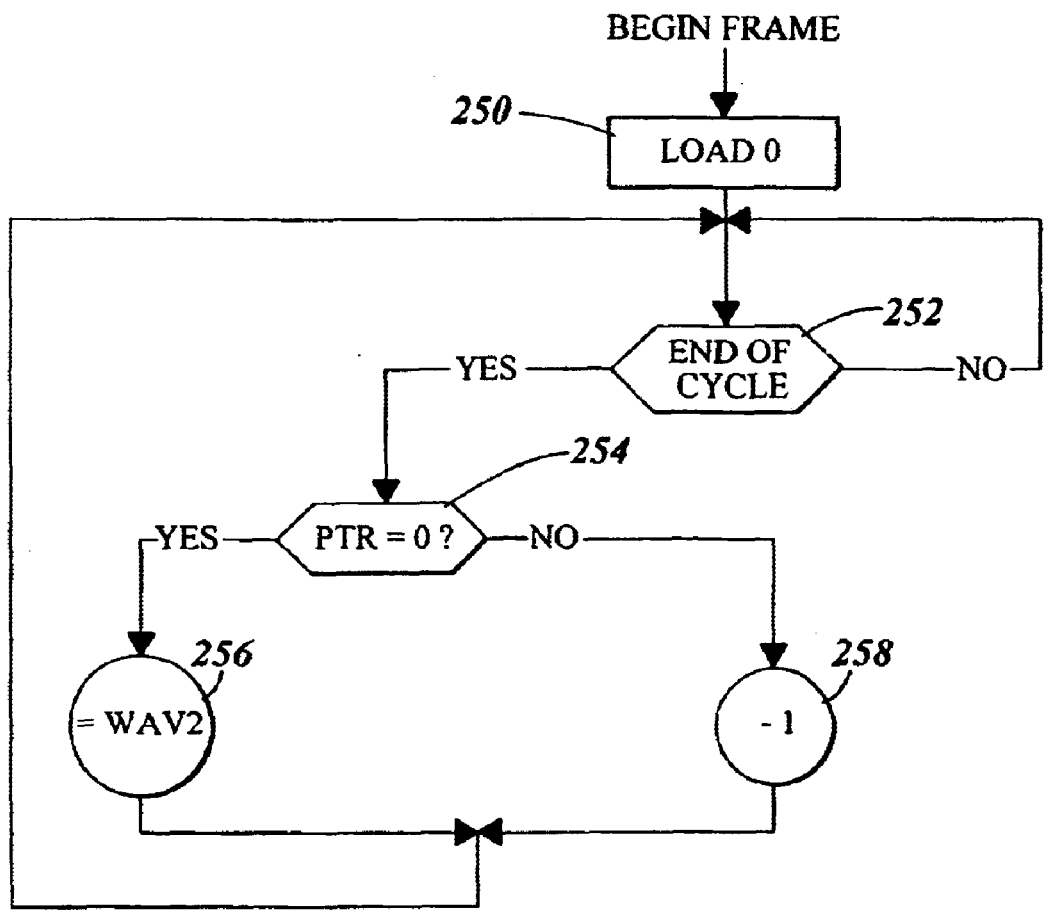
FIG. 9 is a flow diagram illustrating determination of write pointer values for the positive data bank, in accordance with the present invention.

FIG. 9 is a flow diagram illustrating determination of write pointer values for the positive data banks 100B, 101B. At step 250, the write pointer is initially set to zero. At step 252, the process waits for the end of the cycle. When the end of the cycle is reached, it is determined at step 254 whether the write pointer is equal to zero; if not, the write pointer is decremented at step 258; if so, the write pointer is reset to the second wrap around value at step 256.

FIG. 10 is a flow diagram illustrating determination of the pointer value for the center data address pointing to the negative data banks 100A, 101A. At step 260, the center data pointer is initially set to the second wrap-around value. At step 262, the process waits for the end of the cycle. When the end of the cycle is reached, it is determined at step 264 whether the center data pointer is equal to the second wrap-around value; if not, the center data pointer is incremented at step 268; if so, the center data pointer is reset to zero at step 266.

Figure 4:
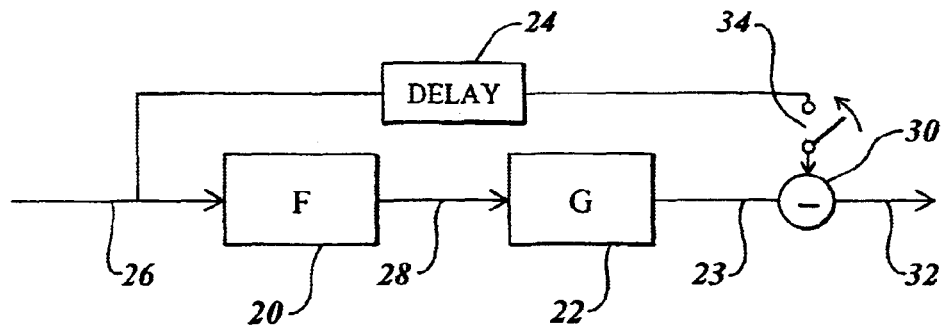
FIG. 4 is a schematic block diagram of a compound FIR filter including a programmable feed forward loop for switching between various frequency discrimination modes (e.g. low-pass, high-pass, etc.), in accordance with the present invention.

FIG. 11 is a flow diagram illustrating the implementation of the delay block 24 for the high-pass filter node illustrated in FIG. 4, which is related to the data in the positive bank 100B of the F-filter 20, in accordance with the present invention. Particularly, the flow diagram of FIG. 11 provides a process by which the delay function is implemented based on the determination of a delay address pointer pointing to a memory location at which the data is stored. For example, the delay function may be determined based on data propagating through the positive nodes 100B of the F-filter data bank 40. At step 270, the delay address pointer is initially set to the second filter bank's coefficient count. At step 272, the process waits for the end of the cycle. When the end of the cycle is reached, it is determined at step 274 whether the delay pointer is equal to zero; if not, the delay pointer is decremented at step 278; if so, the delay pointer is reset to the second wrap around value of the F-filter at step 276.

FIG. 4 is a schematic block diagram of a compound FIR filter including a programmable feed forward loop for switching between low-pass and high-pass filter modes, in accordance with the present invention. In this embodiment, a programmable switch 34 is provided, which, when activated, provides a high-pass filter configuration. When deactivated, a low-pass filter configuration is provided. The switch 34 is programmed according to system parameters received at step 102 of FIG. 3.

While this invention has been particularly shown and described with references to preferred embodiments thereof, it will be understood by those skilled in the art that various changes in form and details may be made herein without departing from the spirit and scope of the invention as defined by the appended claims.

I claim:

1. A compound filter for processing digital data comprising:
   a first filter portion having first computational resources for performing a first filter function;
   a second filter portion having second computational resources for performing a second filter function; and
   wherein at least one of the first and second filter portions is configured to access and utilize the computational resources of the other filter portion for performing a filter function and the first filter portion requires a first number of filter computations ir a sample period, and wherein the second filter portion requires a second number of filter computations in the sample period, and wherein the first and second filter portions share their respective resources when the first number and second number of filter computations are different.

2. The compound filter of claim 1, wherein the first and second filter portions each comprise:

a data bank having a plurality of data nodes;

a coefficient bank for storing filter coefficients;

multiplier for multiplying filter data stored in the data nodes by corresponding filter coefficients stored in the coefficient bank, resulting in product data; and an accumulator for summing the product data to produce filtered data.

3. The compound filter of claim 2, wherein the data bank comprises a negative data bank having negative data nodes, a positive data bank having positive data nodes, and an adder for summing filter data contained in corresponding positive and negative data nodes prior to multiplication with the corresponding filter coefficient.

4. The compound filter of claim 2, wherein the data nodes comprise data registers.

5. The compound filter of claim 2, wherein the date nodes comprise memory locations referenced by pointers.

6. The compound filter of claim 1, wherein the first filter portion comprises an interpolation filter.

7. The compound filter of claim 1, wherein the second filter portion comprises a masking filter.

8. The compound filter of claim 1, wherein each of the first and second computational resources comprises an adder, a multiplier, and an accumulator.

9. The compound filter of claim 1, wherein the first and second filter functions are determined by filter parameters.

10. The compound filter of claim 9, wherein the filter parameters are programmable.

11. The compound filter of claim 10 wherein the filter parameters are selected from a group of parameters consisting of: filter coefficient values; number of coefficients; interpolation value; output scale offset, and high-pass activation switch.

12. The compound filter of claim 1 further comprising a delay unit coupled between an output of the second filter portion and an input of the first filter portion such that the compound filter is configured as a high-pass filter.

13. The compound filter of claim 12, wherein the delay unit has a delay value that is determined based on data propagating through the first filter portion and a coefficient count of the second filter portion.

14. The compound filter of claim 12 further comprising a switch coupled to the delay unit for activating the delay unit.

15. The compound filter of claim 14, wherein the switch is programmable.

16. A method for processing digital data in a compound filter comprising:

performing a first filter function in a first filter portion having first computational resources;

performing a second filter function in a second filter portion having second computational resources;

configuring at least one of the first and second filter portions to access and utilize the computational resources of the other filter portion for performing a filter function;

computing for the first filter portion a first number of filter computations in a sample period; and computing for the second filter portion a second number of filter computations in the sample period, wherein the first and second filter portions share their respective resources when the first number and second number are of filter computations different.

17. The method of claim 16, wherein the step of performing the first and second filter functions each comprise:

providing a data bank having a plurality of data nodes;

providing a coefficient bank for storing filter coefficients;

providing a multiplier for multiplying filter data stored in the data nodes by corresponding filter coefficients stored in the coefficient bank, resulting in product data; and providing an accumulator for summing the product data to produce filtered data.

18. The method of claim 17, wherein the data bank comprises a negative data bank having negative data nodes, a positive data bank having positive data nodes, and an adder for summing filter data contained in corresponding positive and negative data nodes prior to multiplication with the corresponding filter coefficient.

19. The method of claim 17, wherein the data nodes comprise data registers.

20. The method of claim 17, wherein the data nodes comprise memory locations referenced by pointers.

21. The method of claim 16, wherein the first filter portion comprises an interpolation filter.

22. The method of claim 16, wherein the second filter portion comprises a masking filter.

23. The method of claim 16, further providing a delay unit between an output of the second filter portion and an input of the first filter portion such that the compound filter is configured as a high-pass filter.

24. The method of claim 23, wherein the delay unit has a delay value that is determined based on data propagating through the first filter portion and a coefficient count of the second filter portion.

25. The method of claim 23, further comprising providing a programmable switch for activating the delay unit.

* * * * *